(12) United States Patent
Yamanaka

(10) Patent No.: US 8,804,387 B2
(45) Date of Patent: Aug. 12, 2014

(54) POWER SUPPLY APPARATUS AND CONTROLLER

(75) Inventor: Takahiko Yamanaka, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 154 days.

(21) Appl. No.: 13/522,222

(22) PCT Filed: Oct. 17, 2011

(86) PCT No.: PCT/JP2011/073843
§ 371 (c)(1),
(2), (4) Date: Jul. 13, 2012

(87) PCT Pub. No.: WO2012/060207
PCT Pub. Date: May 10, 2012

(65) Prior Publication Data
US 2012/0281433 A1    Nov. 8, 2012

(30) Foreign Application Priority Data
Nov. 2, 2010 (WO) .................. PCT/JP2010/069522

(51) Int. Cl.
*H02M 5/42* (2006.01)
(52) U.S. Cl.
USPC .............................. 363/84; 363/85
(58) Field of Classification Search
USPC .................... 363/52, 53, 84, 85, 125, 127
See application file for complete search history.

(56) References Cited

U.S. PATENT DOCUMENTS

| | | | | |
|---|---|---|---|---|
| 7,456,620 B2* | 11/2008 | Maksimovic et al. | ........ | 323/283 |
| 8,541,997 B2* | 9/2013 | Jiang et al. | .................... | 323/282 |
| 2003/0227280 A1* | 12/2003 | Vinciarelli | ..................... | 323/265 |
| 2004/0174147 A1* | 9/2004 | Vinciarelli | ..................... | 323/266 |
| 2006/0006847 A1 | 1/2006 | Chen | | |
| 2006/0152204 A1* | 7/2006 | Maksimovic et al. | ........ | 323/284 |
| 2006/0236013 A1 | 10/2006 | Okeda | | |

(Continued)

FOREIGN PATENT DOCUMENTS

EP    2 045 538 A2    4/2009
JP    01-184503 A    7/1989

(Continued)

OTHER PUBLICATIONS

International Search Report for PCT/JP2011/073843 dated Jan. 17, 2012.

(Continued)

*Primary Examiner* — Bao Q Vu
(74) *Attorney, Agent, or Firm* — Sughrue Mion, PLLC

(57) ABSTRACT

To measure input power as accurate as possible, a power supply apparatus includes an AC/DC converter that generates a direct-current internal power supply from an alternating-current commercial power supply, an output-voltage measurement unit that measures an output voltage of the internal power supply, an output-current measurement unit that measures an output current of the internal power supply, a temperature measurement unit that measures an environmental temperature of the power supply apparatus itself, a storage device that stores therein in advance conversion efficiency data in which a correspondence between a conversion efficiency η of the AC/DC converter and the environmental temperature is recorded, and a computation unit that determines the conversion efficiency η based on the environmental temperature and the conversion efficiency data and calculates the input power of the commercial power supply by using the determined conversion efficiency η, the output voltage, and the output current.

18 Claims, 10 Drawing Sheets

(56) References Cited

U.S. PATENT DOCUMENTS

| | | | |
|---|---|---|---|
| 2009/0261791 A1* | 10/2009 | Lopata et al. | 323/282 |
| 2011/0095742 A1* | 4/2011 | Lopata et al. | 323/283 |
| 2011/0101933 A1* | 5/2011 | Lopata et al. | 323/271 |
| 2011/0101934 A1* | 5/2011 | Lopata et al. | 323/271 |
| 2011/0101948 A1* | 5/2011 | Lopata et al. | 323/283 |

FOREIGN PATENT DOCUMENTS

| | | | |
|---|---|---|---|
| JP | 3-292501 A | 12/1991 |
| JP | 2000-125545 A | 4/2000 |
| JP | 2006-184063 A | 7/2006 |
| JP | 2006-294007 A | 10/2006 |
| JP | 2009-103427 A | 5/2009 |

OTHER PUBLICATIONS

Chinese Office Action mailed Feb. 20, 2014, Application No. 2011800116498.

* cited by examiner

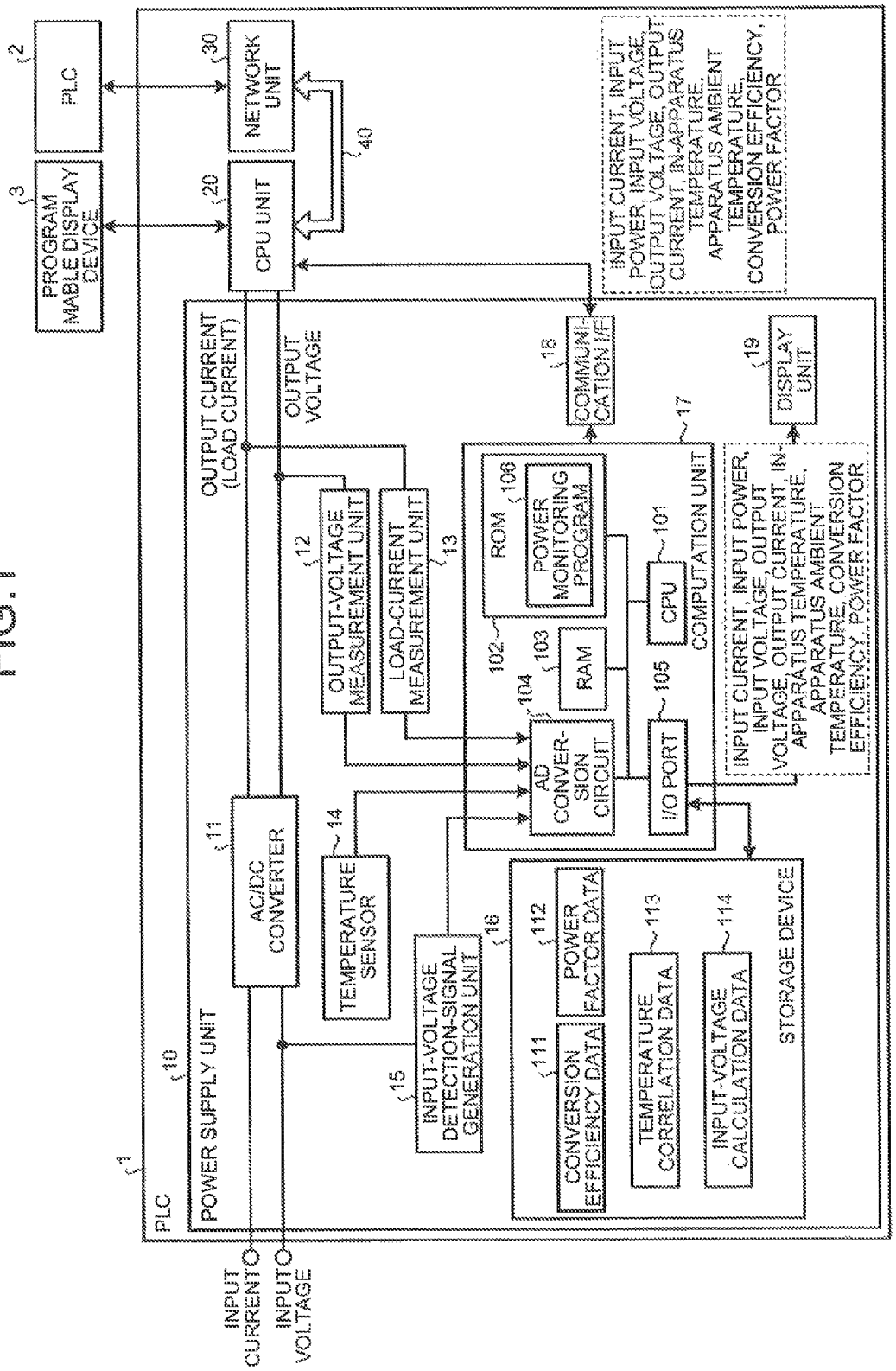

V: FIXED PARAMETER OF THRESHOLD VOLTAGE
Va: AMPLITUDE OF AC INPUT WAVEFORM
F: FREQUENCY OF AC INPUT WAVEFORM
T: TIME DURING WHICH AC-INPUT VOLTAGE VALUE IS INCREASED TO V
Toff: OFF TIME OF INPUT-VOLTAGE DETECTION SIGNAL (PULSE WAVEFORM)
Fb: PERIOD OF AC-INPUT-VOLTAGE DETECTION SIGNAL (PULSE WAVEFORM)

FIG.7

| THRESHOLD VOLTAGE | FREQUENCY OF AC INPUT WAVEFORM | PERIOD OF INPUT-VOLTAGE DETECTION SIGNAL | TIME DURING WHICH INPUT VOLTAGE VALUE IS INCREASED TO V | OFF TIME OF INPUT-VOLTAGE DETECTION SIGNAL | INPUT VOLTAGE | |
|---|---|---|---|---|---|---|
| | | | | | AMPLITUDE OF INPUT VOLTAGE $Va=V/\sin(2\cdot\pi\cdot Fb\cdot Toff)$ | EFFECTIVE VALUE OF Va |
| V[V] | F[Hz] | Fb[Hz] | T[ms] | Toff(2T)[ms] | | |
| 85 | 50 | 25 | 2.5 | 5 | 120.2 | 85.0 |
| 85 | 50 | 25 | 2.053 | 4.106 | 141.4 | 100.0 |
| 85 | 50 | 25 | 1.751 | 3.502 | 162.6 | 115.0 |
| 85 | 50 | 25 | 1.53 | 3.06 | 183.8 | 130.0 |
| 85 | 50 | 25 | 1.361 | 2.722 | 205.0 | 144.9 |
| 85 | 50 | 25 | 1.226 | 2.452 | 226.2 | 160.0 |
| 85 | 50 | 25 | 1.116 | 2.232 | 247.5 | 175.0 |
| 85 | 50 | 25 | 1.025 | 2.05 | 268.6 | 189.9 |
| 85 | 50 | 25 | 0.947 | 1.894 | 290.0 | 205.0 |
| 85 | 50 | 25 | 0.881 | 1.762 | 311.1 | 220.0 |
| 85 | 50 | 25 | 0.823 | 1.646 | 332.4 | 235.1 |
| 85 | 50 | 25 | 0.8055 | 1.611 | 339.5 | 240.1 |
| 85 | 50 | 25 | 0.773 | 1.546 | 353.5 | 249.9 |
| 85 | 50 | 25 | 0.728 | 1.456 | 374.9 | 265.1 |
| 85 | 60 | 30 | 2.083 | 4.166 | 120.2 | 85.0 |
| 85 | 60 | 30 | 1.71 | 3.42 | 141.4 | 100.0 |
| 85 | 60 | 30 | 1.459 | 2.918 | 162.6 | 115.0 |
| 85 | 60 | 30 | 1.275 | 2.55 | 183.8 | 130.0 |
| 85 | 60 | 30 | 1.134 | 2.268 | 205.0 | 145.0 |
| 85 | 60 | 30 | 1.022 | 2.044 | 226.2 | 159.9 |
| 85 | 60 | 30 | 0.93 | 1.86 | 247.5 | 175.0 |
| 85 | 60 | 30 | 0.854 | 1.708 | 268.6 | 190.0 |
| 85 | 60 | 30 | 0.789 | 1.578 | 290.0 | 205.1 |
| 85 | 60 | 30 | 0.734 | 1.468 | 311.1 | 220.0 |
| 85 | 60 | 30 | 0.686 | 1.372 | 332.4 | 235.0 |
| 85 | 60 | 30 | 0.644 | 1.288 | 353.6 | 250.0 |
| 85 | 60 | 30 | 0.607 | 1.214 | 374.7 | 265.0 |

POWER SUPPLY APPARATUS AND CONTROLLER

CROSS REFERENCE TO RELATED APPLICATIONS

This application is a National Stage of International Application No. PCT/JP2011/073843 filed Oct. 17, 2011, claiming priority based on International Application No. PCT/JP2010/069522 filed Nov. 2, 2010, the contents of all of which are incorporated herein by reference in their entirety.

FIELD

The present invention relates to a power supply apparatus including an AC/CD converter and a controller including an AC/CD converter.

BACKGROUND

Generally, a power supply unit (a power supply apparatus) that performs AC/DC conversion of a commercial alternating-current power supply to generate a direct-current internal power supply is incorporated in a programmable controller (PLC) that controls an industrial machine. A function of performing power monitoring is sometimes incorporated in such a power supply unit so as to be used for performing monitoring related to an energy-saving operation and analysis for finding abnormalities. For example, Patent Literature 1 discloses a technique related to a power supply unit that measures an input voltage, an input current, an output voltage, an output current, and a temperature within the power supply unit and that outputs these values.

However, when it is attempted to directly measure input power, a large and expensive part such as a voltage transformer (VT) or a current transformer (CT) needs to be incorporated, which leads to disadvantages of product distribution.

To handle this problem, Patent Literature 2 discloses a technique of measuring an output voltage and an output current and then calculating input power by using the measured output voltage and output current and a conversion efficiency of AC/DC conversion obtained by being measured in advance (hereinafter, sometimes simply "efficiency"). According to this technique, because the input power is supposed to be indirectly determined by the output power and the efficiency, the part mentioned above is not required.

Citation List

Patent Literatures

Patent Literature 1: Japanese Patent Application Laid-open No. 2006-294007
Patent Literature 2: Japanese Patent Application Laid-open No. 2006-184063

SUMMARY

Technical Problem

However, because the efficiency changes greatly depending on a temperature, the technique of Patent Literature 2 mentioned above has a problem that the input power cannot be accurately determined.

The present invention has been achieved in view of the above problem, and an object of the present invention is to provide a power supply apparatus and a controller that can measure input power as accurate as possible.

Solution to Problem

In order to solve the above problem and in order to attain the above object, a power supply apparatus of the present invention, includes: an AC/DC converter that takes an alternating-current commercial power supply as an input, generates a direct-current power supply, and outputs the generated direct-current power supply; an output-voltage measurement unit that measures an output voltage of a direct-current power supply output by the AC/DC converter; an output-current measurement unit that measures an output current of a direct-current power supply output by the AC/DC converter; a temperature measurement unit that measures an environmental temperature; a storage device that stores therein in advance conversion efficiency data in which a correspondence between a conversion efficiency η of the AC/DC converter and the environmental temperature is recorded; and a computation unit that determines the conversion efficiency η based on a measured value of an environmental temperature by the temperature measurement unit and the conversion efficiency data, calculates input power of a commercial power supply input to the AC/DC converter by using the determined conversion efficiency η, a measured value of an output voltage by the output-voltage measurement unit, and a measured value of an output current by the output-current measurement unit, and outputs the calculated input power.

Advantageous Effects of Invention

The power supply apparatus according to the present invention stores therein in advance conversion efficiency data in which a correspondence between a conversion efficiency η of an AC/DC converter and an environmental temperature is recorded, measures the environmental temperature, determines the conversion efficiency η based on the measured environmental temperature and the conversion efficiency data, and calculates input power by using the determined conversion efficiency η, and therefore the input power can be measured as accurate as possible.

BRIEF DESCRIPTION OF DRAWINGS

FIG. 1 is a configuration example of a PLC according to a first embodiment.
FIG. 4-1 is an explanatory diagram of an arrangement example of a temperature sensor according to the first embodiment.
FIG. 4-2 is an explanatory diagram of an arrangement example of the temperature sensor according to the first embodiment.
FIG. 7 is an example of a data structure of input-voltage calculation data.

FIG. 9 is an explanatory diagram of an operation in which a power supply unit according to the first embodiment calculates an input current or the like.

FIG. 12-1 is an explanatory diagram of an arrangement example of a temperature sensor according to a fourth embodiment.

FIG. 12-2 is an explanatory diagram of an arrangement example of the temperature sensor according to the fourth embodiment.

DESCRIPTION OF EMBODIMENTS

Exemplary embodiments of a power supply apparatus and a controller according to the present invention will be explained below in detail with reference to the accompanying drawings. The present invention is not limited to the embodiments.

First Embodiment

Figures 1, 4:
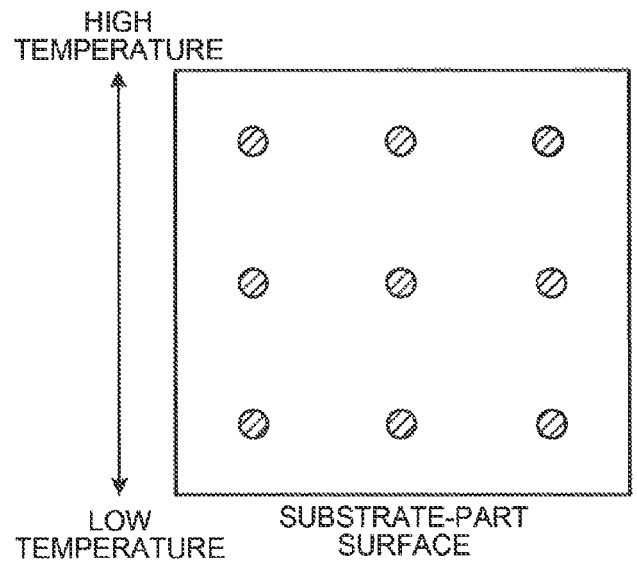
Figures 2, 4:
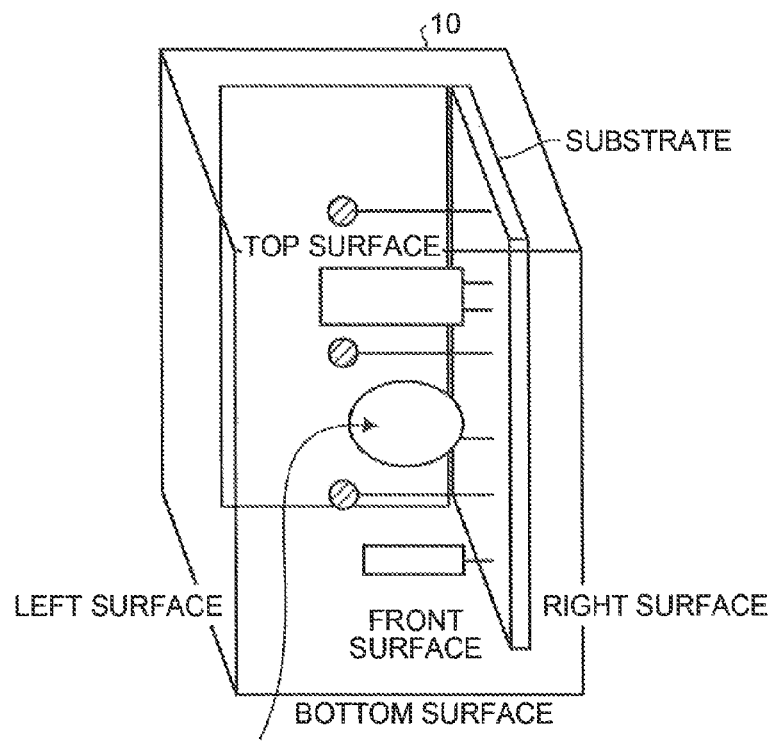

FIG. 1 is a configuration example of a PLC according to a first embodiment of the present invention. As shown in FIG. 1, a PLC 1 includes a CPU unit 20 that controls an overall operation of the PLC 1, which controls an industrial machine, a network unit 30 that is a sub unit for applying a network connecting function to the PLC 1, a PLC bus 40 for transferring data between the CPU unit 20 and the sub-unit, and a power supply unit 10 that generates a direct-current internal power supply, which drives the respective constituent elements (the CPU unit 20, the network unit 30, and the PLC bus 40), from an alternating-current commercial power supply. In practice, the PLC bus 40 is incorporated in another unit referred to as "base unit" that is different from the three units mentioned above, and the PLC 1 is configured by attaching the power supply unit 10, the CPU unit 20, and the network unit 30 to the base unit. Although not explained in detail, in addition to the network unit 30, sub-units having various functions are attached to the base unit and a desired sub-unit is selected and attached according to usage purposes.

According to the first embodiment of the present invention, the power supply unit 10 outputs an input current, an input voltage, and input effective power (input power) from the commercial power supply, an output voltage and an output current serving as the internal power supply, an average temperature within the power supply unit 10 (an in-apparatus temperature), a temperature around the PLC 1 (an apparatus ambient temperature), a conversion efficiency η, and a power factor φ (hereinafter, the above-mentioned pieces of output information are collectively referred to as "input current or the like"). A PLC 2 different from the PLC 1 and serving as an external device is connected via the network unit 30 to the PLC 1, and a programmable display device 3 serving as an external device having a function of displaying the content of a device memory to the CPU unit 20 is also connected to the PLC 1. The input current or the like output by the power supply unit 10 is temporarily sent to the CPU unit 20 and then can be monitored from the programmable display device 3. The input current or the like sent to the CPU unit 20 can be monitored from the PLC 2 via the PLC bus 40 and the network unit 30.

To determine the input current without using a large and expensive part such as VT or CT, the power supply unit 10 measures not the input current directly but the output current and output voltage, and determines the input power and the input current from these measured values, the efficiency η, and the power factor φ by using the following relational expressions.

$$\text{Input power} = \text{output voltage} \times \text{output current} / \text{efficiency } \eta \quad (1)$$

$$\text{Input current} = \text{input power} / (\text{input voltage} \times \text{power factor}) \quad (2)$$

Figure 2:
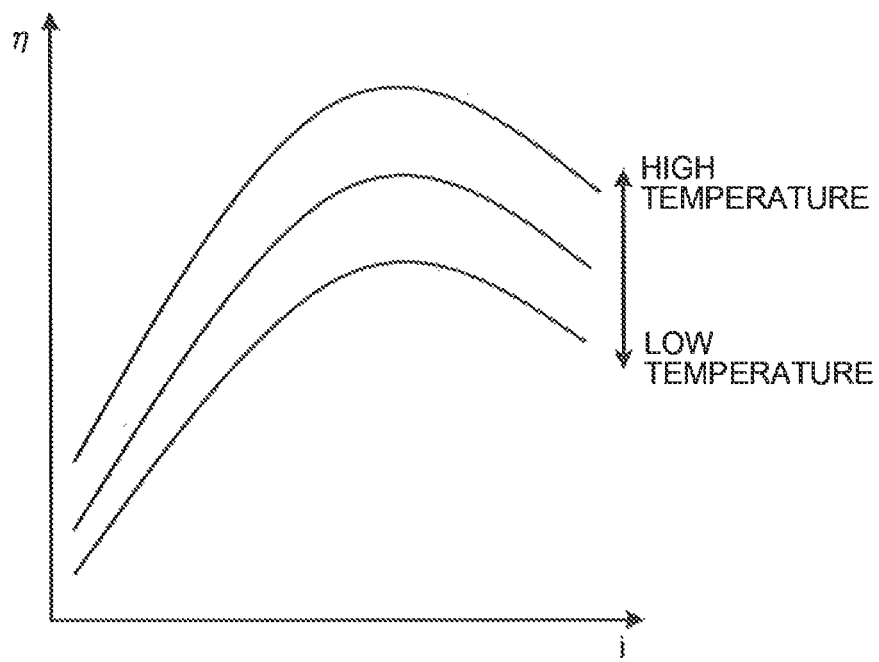
FIG. 2 is an explanatory diagram of an example of temperature dependency of an efficiency η.
Figure 3:
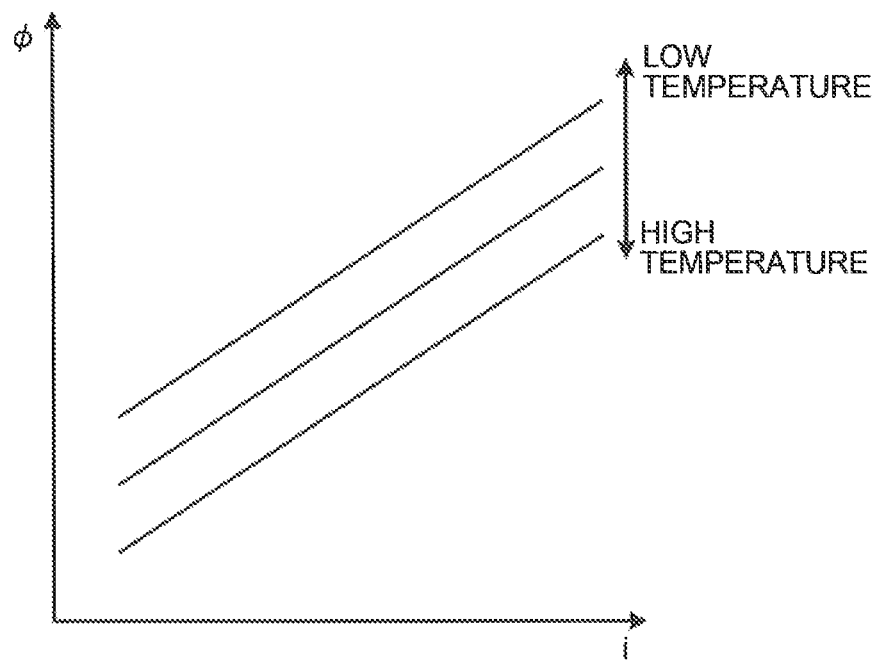
FIG. 3 is an explanatory diagram of an example of temperature dependency of a power factor φ.

The efficiency η and the power factor φ of the power supply unit 10 change depending on an environmental temperature. FIG. 2 is an explanatory diagram of an example of temperature dependency of the efficiency η and FIG. 3 is an explanatory diagram of an example of temperature dependency of the power factor φ. Horizontal axes in FIGS. 2 and 3 represent a current i. As shown in FIGS. 2 and 3, as the temperature is increased, the efficiency η is also increased and as the temperature is reduced, the bower factor φ is increased. According to the first embodiment of the present invention, to determine the input power and the input current as accurate as possible, data in which the correspondence relationship between the efficiency η and the environmental temperature (and the current) is described (conversion efficiency data 111) and data in which the correspondence relationship between the power factor φ and the environmental temperature (and the current) is described (power factor data 112) are stored. The power supply unit 10 determines the efficiency η and the power factor φ applied to the above expressions (1) and (2) based on these pieces of data. In the correspondence relationships described in the conversion efficiency data 111 and the power factor data 112, the apparatus ambient temperature is used as the environmental temperature and the output current is used as the current.

Referring back to FIG. 1, the power supply unit 10 includes an AC/DC converter 11, an output-voltage measurement unit 12, a load-current measurement unit 13, a temperature sensor 14, an input-voltage detection-signal generation unit 15, a storage device 16, a computation unit 17, a communication interface (I/F) 18, and a display unit 19.

The AC/DC converter 11 converts an input commercial power supply into an internal power supply. For easy understanding, an input of the commercial power supply is shown as divided into the input current and the input voltage, and an output of the internal power supply is shown as divided into the output current and the output voltage in FIG. 1. The internal power supply is supplied to the CPU unit 20, the PLC bus 40, and the network unit 30.

The output-voltage measurement unit 12 measures an output voltage from the AC/DC converter 11 and sends an analog measured value of the measured output voltage to the computation unit 17. The load-current measurement unit 13 measures an output current from the AC/DC converter, that is, a load current that is the total current consumed by the CPU unit 20 or the like and sends an analog measured value of the measured load current to the computation unit 17. The load-current measurement unit 13 can measure the current by a simple method. For example, a small load resistor is inserted on a line that outputs a current and the load-current measurement unit 13 measures a voltage across ends of the load resistor.

For example, the temperature sensor 14 is configured by a thermocouple or a thermistor. Generally, loss of the power supply apparatus (including a switching regulator) is caused largely by a switching element, but a large number of loss factors exist in other in-apparatus parts (an FET, a diode, a shunt resistor, a dummy resistor, an LC filter, a snubber circuit, a transformer, and a bridge diode) and each of the parts has temperature dependency. That is, the temperature within the power supply apparatus varies greatly depending on a measurement spot. Accordingly, to determine the efficiency η of the power supply apparatus (=100–the total loss of the entire apparatus [%]), the temperature of the entire power supply apparatus needs to be precisely determined, unlike partial temperature measurement of the switching element. The temperature sensor 14 is arranged at a plurality of points within the power supply unit 10 and an average of temperature detected values of the respective points is determined. This average temperature is represented as the in-apparatus temperature of the power supply unit 10.

FIGS. 4-1 and 4-2 are explanatory diagrams of an arrangement example of the temperature sensor 14. FIG. 4-1 depicts a substrate-part surface within the power supply unit 10 as viewed from a top surface. FIG. 4-2 is a perspective diagram of the inside of the power supply unit 10. The PLC 1 is installed so that the substrate-part surface is parallel to a control panel. Consequently, as shown in FIG. 4-2, a vertical line of the substrate-part surface is parallel to the ground. A ventilation hole (not shown) for discharging heat is provided on a top surface, a bottom surface, and a left surface of FIG. 4-2. The respective parts on a substrate are cooled by air flowing from the bottom surface to the top surface mainly by convection. The temperature is thus increased as approaching the top surface. To precisely measure the in-apparatus temperature, three temperature sensors 14 are provided in a top-bottom direction of FIG. 4-2 at equal intervals therebetween. As shown in FIG. 4-1, three temperature sensors 14 are provided also in a front-rear direction of FIG. 4-2 at equal intervals therebetween. Nine temperature sensors 14 are thus provided on the substrate-part surface in total. The in-apparatus temperature is determined by averaging detected values by these nine temperature sensors 14.

When the conversion efficiency data 111 and the power factor data 112 are formed, it is easier to measure the efficiency η and the power factor φ for each apparatus ambient temperature as compared to measuring them for each in-apparatus temperature. The conversion efficiency data 111 and the power factor data 112 respectively use the apparatus ambient temperature as the environmental temperature and the apparatus ambient temperature for determining the efficiency η and the power factor φ estimated from the in-apparatus temperature. A configuration for calculating the apparatus ambient temperature is described later.

Figure 5:
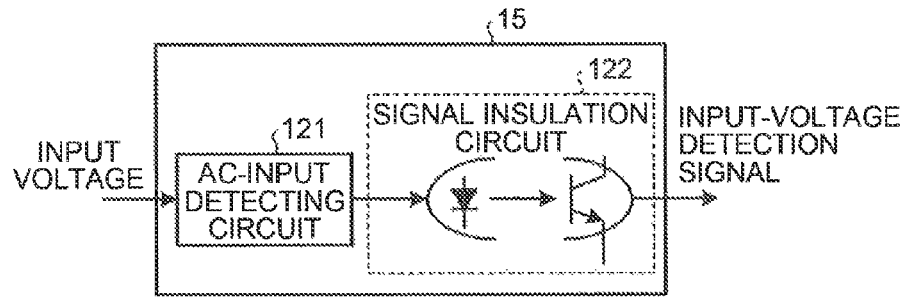
FIG. 5 is an explanatory diagram of a detailed configuration of an input-voltage detection-signal generation unit.

The input-voltage detection-signal generation unit 15 generates an input-voltage detection signal used for calculating the input voltage. FIG. 5 is an explanatory diagram of a further detailed configuration of the input voltage detection-signal generation unit 15. As shown in FIG. 5, the input-voltage detection-signal generation unit 15 includes an AC-input detecting circuit 121 and a signal insulation circuit 122 configured by a photo-coupler. The AC-input detecting circuit 121 detects the input voltage, rectifies a detected alternating-current input-voltage wave into a full-wave rectified wave by a diode bridge, adjusts a size of the full-wave rectified wave, and inputs the resultant one to the signal insulation circuit 122. The signal insulation circuit 122 generates a pulse signal from the input full-wave rectified wave and outputs the generated pulse signal as the input-voltage detection signal. Consequently, the input-voltage detection-signal generation unit 15 uses a voltage value V decided by an adjustment rate of the AC-input detecting circuit 121 and a threshold when the signal insulation circuit 122 outputs a rise of the pulse waveform as a threshold and outputs a pulse signal that becomes ON when an amplitude of a waveform of the input voltage exceeds the threshold V.

Figure 6:
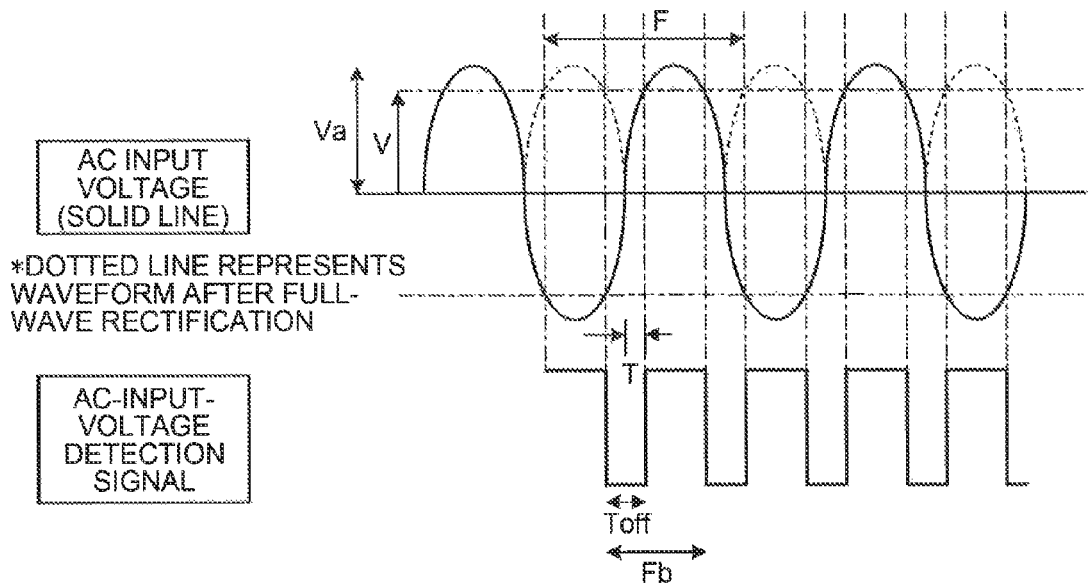
FIG. 6 is an explanatory diagram of waveforms of an input voltage wave, a full-wave rectified wave, and an input-voltage detection signal.

FIG. 6 is an explanatory diagram of waveforms of the input voltage wave, the full-wave rectified wave, and the input-voltage detection signal. As shown in FIG. 6, when an amplitude of the input voltage wave, is denoted by Va, a frequency is denoted by F, a time during which the input, voltage wave is increased from 0 to V is denoted by T, an OFF time of the input-voltage detection signal is denoted by Toff, and a period of the input-voltage detection signal is denoted by Fb, the following relationship is established. As explained above, V is a threshold voltage for a pulse of the input-voltage detection signal rising by the signal insulation circuit 122.

$$\text{Toff}=2T \quad (3)$$

$$F=2Fb \quad (4)$$

$$V=Va\times\sin(2\pi FT) \quad (5)$$

Accordingly, the amplitude Va of the input voltage wave can be easily determined by $$Va=V/\sin(2\pi\cdot Fb\cdot \text{Toff}) \quad (6).$$

Referring back to FIG. 1, the storage device 16 is configured by a ROM (Read Only Memory), for example, and the conversion efficiency data 111, the power factor data 112, temperature correlation data 113, and input-voltage calculation data 114 are stored therein in advance.

The conversion efficiency data 111 is table configuration data in which the relationship among the efficiency η, the output current, and the apparatus ambient temperature is described. By designating and then referring to an output current value and the apparatus ambient temperature, the efficiency η can be read. The power factor data 112 is table-configuration data in which the relationship among the power factor φ, the output current, and the apparatus ambient temperature is described. By designating and then referring to the output current and the apparatus ambient temperature, the power factor φ can be read.

The temperature correlation data 113 is table-configuration data in which a correspondence between the in-apparatus temperature and the apparatus ambient temperature is described.

The input-voltage calculation data 114 is a table for determining the input voltage from the input-voltage detection signal. The amplitude Va of the input voltage has the relationship such as the expression (6) among V, Fb, and Toff. An effective value of the input voltage is determined by dividing the amplitude Va by the square root of 2. The input-voltage calculation data 114 has a table data structure in which the relationship among V, Fb, Toff, and the input voltage the effective value) is described so that the expression (6) does not need to be computed, and this data structure is shown in FIG. 7, for example. In the following explanations, the input voltage and the input current respectively indicate effective values, unless otherwise specified.

The computation unit 17 calculates the input current or the like based on an output voltage value detected by the output-voltage measurement unit 12, an output current value measured by the load-current measurement unit 13, measured values (temperature detected Values) corresponding to temperatures detected respectively by a plurality of the temperature sensors 14, an input voltage signal generated by the input-voltage detection-signal generation unit 15, and data stored in the storage device 16.

The computation unit 17 is configured by a microcomputer, for example. Specifically, the computation unit 17 includes a CPU (Central Processing Unit) 101, a ROM 102, a RAM (Random Access Memory) 103, an AD (Analog Digital) conversion circuit 104, and an I/O port 105. A power monitoring program 106 that is a computer program for calculating the input power or the like is stored in the ROM 102. The AD conversion circuit 104 converts the output voltage value, the output current value, a plurality of temperature detected values, and the input-voltage detection signal input as analog values into digital values. The I/O port 105 is an interface for accessing the storage device 16. The CPU 101 is realized as various functional units to be explained later by reading the power monitoring program 106 from the ROM 102 and performing the same. The CPU 101 obtains various measured values from the AD conversion circuit 104 and reads the various data via the I/O port 105 from the storage device 16 for calculating the input power or the like. The RAM 103 is used as a work area for the CPU 101 calculating the input power or the like.

The communication I/F 18 is a connection interface for sending the input current or the like calculated by the computation unit 17 to the CPU unit 20.

The display unit 19 is a display device for displaying and outputting the input current or the like calculated by the computation unit 17 and configured by a compact liquid-crystal display or a seven-segment display, for example.

Figure 8:
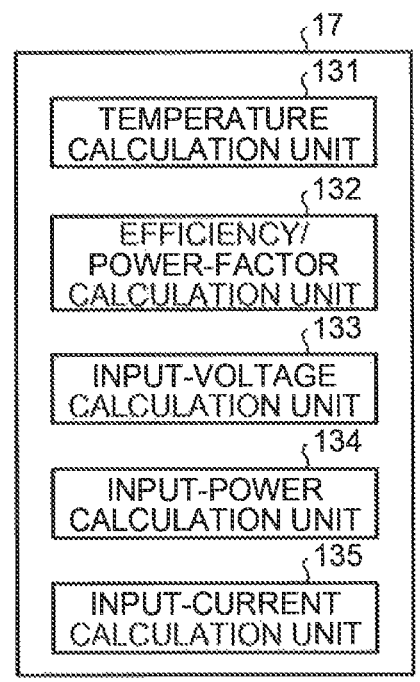
FIG. 8 is an explanatory diagram of functional units of a computation unit according to the first embodiment.

FIG. 8 is an explanatory diagram of functional units realized by the CPU 101 performing the power monitoring program 106. As shown in FIG. 8, the computation unit 17 includes a temperature calculation unit 131 that calculates the in-apparatus temperature and the apparatus ambient temperature based on temperature detected values by the temperature sensors 14 and the temperature correlation data 113, an efficiency/power-factor calculation unit 132 that calculates the efficiency η and the power factor φ based on the calculated apparatus ambient temperature, the output current value, the conversion efficiency data 111, and the power factor data 112, an input-voltage calculation unit 133 that calculates the input voltage based on the input-voltage detection signal and the input-voltage calculation data 114, an input-power calculation unit 134 that calculates the input power based on the output current value, the output voltage value, and the calculated efficiency η, and an input-current calculation unit 135 that refers to the input current based on the calculated input power, the calculated power factor φ, and the calculated input voltage.

Figure 9:
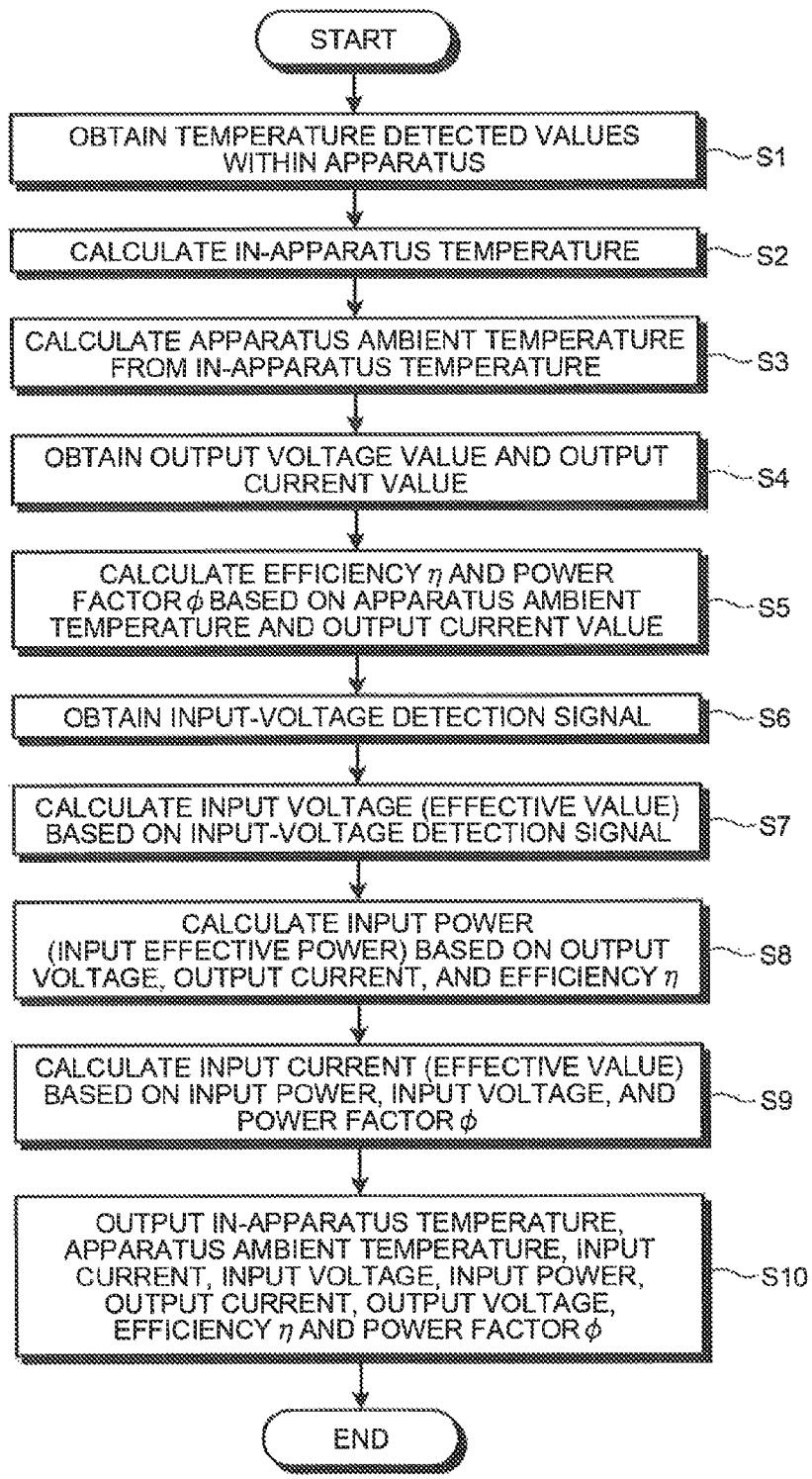

FIG. 9 is an explanatory diagram of an operation in which the power supply unit 10 according to the first embodiment of the present invention calculates the input current or the like. As shown in FIG. 9, the temperature calculation unit 131 obtains temperature detected values within the power supply unit 10 (Step S1), averages the obtained temperature detected values, and calculates the in-apparatus temperature (Step S2). The temperature calculation unit 131 then converts the in-apparatus temperature into the apparatus ambient temperature by using the temperature correlation data 113 (Step S3). The in-apparatus temperature and the apparatus ambient temperature are temporarily stored in the work area within the RAM 103. As well as the in-apparatus temperature and the apparatus ambient temperature, the input current or the like calculated in subsequent steps is also temporarily stored in this work area and appropriately read at the time of computing.

Meanwhile, the efficiency/power-factor calculation unit 132 obtains the output voltage value and the output current value (Step S4). The efficiency/power-factor calculation unit 132 then determines the efficiency η and the power factor φ based on the calculated apparatus ambient temperature and the output current value (Step S5). Specifically, the efficiency/power-factor calculation unit 132 refers to the conversion efficiency data 111 to determine the efficiency η corresponding to the calculated apparatus ambient temperature and the obtained output current value and refers to the power factor data 112 to determine the power factor φ corresponding to the apparatus ambient temperature and the output current value.

The input-voltage calculation unit 133 obtains the input-voltage detection signal (Step S6). The obtained input-voltage detection signal is time-serially accumulated and stored in the RAM 103. The input voltage calculation unit 133 determines the input voltage based on the obtained input-voltage detection signal and the input-voltage calculation data 114 (Step S7). Specifically, the input-voltage calculation unit 133 determines the period Fb and the OFF time Toff of the pulse waveform from the input-voltage detection signal accumulated and stored in the RAM 103. The input-voltage calculation data 114 is then searched for by using the determined Fb and Toff and the threshold voltage V as search keys and the input voltage (the effective value) is determined.

The input-power calculation unit 134 determines the input power by applying the calculated output voltage, the calculated output current, and the calculated efficiency η to the expression (1) (Step S8). The input-current calculation unit 135 determines the input current by applying the determined input power, the determined input voltage, and the determined power factor φ to the expression (2) (Step S9). The computation unit 17 outputs the in-apparatus temperature, the apparatus ambient temperature, the input current, the input voltage, the input power, the output current, the output voltage, the efficiency η, and the power factor φ determined in the above steps to the display unit 19 and to the CPU unit 20 via the communication I/F 18 (Step S10), and the process ends. The process of Step S1 to Step S10 is repeatedly performed at a desired time interval or a desired timing. The input current or the like output to the CPU unit 20 is sent to the programmable display device 3. The input current or the like is also sent via the PLC bus 40 and the network unit 30 to the PLC 2.

An order of processes of Step S1 to Step S10 is an example and the order of processes is not limited to this order.

While it has been explained that the PLC 1 is functionally divided into the power supply unit 10, the CPU unit 20, the network unit 30, and the PLC bus 40 in the first embodiment of the present invention, these constituent elements can be integrally configured.

While it has been explained that the AC-input detecting circuit 121 rectifies an input voltage wave to a full-wave rectified wave, the AC-input detecting circuit 121 can rectify the input voltage wave to a half-wave rectified wave. In this case, the expression (3) can be substituted by the following expression (7), and the expression (4) can be substituted by the following expression (8)

$$T = T\text{off} - 1/(2 \cdot Fb) \quad (7)$$

$$F = Fb \quad (8)$$

Alternatively, the AC-input detecting circuit 121 can merely adjust a wave height without rectification. In this case, the signal insulation circuit 122 picks up only positive-side signals and thus the above expressions (7) and (8) can be used.

While it has been explained that the apparatus ambient temperature is used as the temperature and the output current is used as the current in the correspondence relationships described in the conversion efficiency data 111 and the power factor data 112, the in-apparatus temperature can be used as the temperature.

As explained above, according to the first embodiment of the present invention, the conversion efficiency η is determined based on a measured value of the apparatus ambient temperature or the in-apparatus temperature serving as the environmental temperature and the conversion efficiency data 111 stored in the storage device 16 in advance in which a correspondence between the conversion efficiency η of the AC/DC converter 11 and the environmental temperature is recorded, and the input power is calculated by using the determined conversion efficiency η, a measured output voltage, and a measured output current. Accordingly, the input power can be measured as accurate as possible.

The power factor φ is determined based on the measured value of the environmental temperature and the conversion efficiency data 111 stored in the storage device 16 in advance in which a correspondence between the power factor φ of the AC/DC converter 11 and the environmental temperature is recorded, the input voltage of the commercial power supply input to the AC/DC converter 11 is further measured, and the input current is calculated by using the power factor φ, the efficiency η, the input voltage, the output voltage, and the output current. Accordingly, the input current can be measured as accurate as possible.

The temperature sensor 14 is provided at a plurality of points within the power supply unit 10 and the environmental temperature is calculated from temperature detected values by the temperature sensors 14. The environmental temperature can thus be measured without excessively influenced by a variation in temperature and a variation in the increase rate of temperature for each part. Consequently, the input power can be measured more accurately.

The environmental temperature is an average value of temperature detected values by the temperature sensors 14.

The environmental temperature is an estimated value of the ambient temperature of the PLC 1 and the measured value of the environmental temperature is obtained based on the temperature correlation data stored in the storage device 16 in advance in which the correspondence relationship between the average value of temperature detected values and the ambient temperature of the PLC 1 is recorded. Accordingly, the conversion efficiency data 111 can be easily formed in advance.

The conversion efficiency data 111 is data in which a correspondence among the efficiency η, the environmental temperature, and the output current is recorded. The power factor data 112 is data in which a correspondence among the power factor φ, the environmental temperature, and the output current is recorded. The conversion efficiency η is determined based on the measured value of the environmental temperature, the measured value of the output current, and the conversion efficiency data 111. The power factor φ is determined based on the measured value of the environmental temperature, the measured value of the output current, and the power factor data 112. Accordingly, the input current and the input power can be calculated by taking changes in the efficiency η and the power factor φ depending on the output current also into consideration and thus the input current and the input power can be calculated more accurately.

A pulse wave that becomes ON when the voltage value input in a state of an input voltage wave is equal to or larger than the predetermined threshold V is generated by using a signal insulation circuit having its input side and output side electrically insulated from each other, and the input voltage is calculated based on the generated pulse wave. Accordingly, the input voltage can be easily measured in an insulated state.

Because the PLC further includes the display unit 19 that displays and outputs the input power or the input current, a user can confirm the input power or the input current on the spot.

Because the CPU unit 20, the network unit 30, and the PLC bus 40 serving as an external output unit that outputs the input power or the input current to the programmable display device 3 and the PLC 2 serving as external devices connected to the PLC 1 are provided, a user can confirm the input power or the input current from a remote location.

Second Embodiment

It the first embodiment, it has been explained that a direction of mounting the PLC 1 is fixed and as shown in FIG. 4-2, the PLC 1 is mounted so that the substrate-part surface is parallel to a control panel. In the PLC 1, when the direction of mounting the PLC 1 is different from an expected direction, for example, the PLC 1 is mounted upside down, an air flow within the apparatus is changed and thus a temperature detected value by each temperature sensor 14 is also changed. The in-apparatus temperature is thus different from an intended value. Consequently, the input power or the like cannot be determined accurately. According to a second embodiment, temperature correlation data in which the relationship between a calculated value of the in-apparatus temperature and the apparatus ambient temperature is described is prepared for each mounting direction. Accordingly, the input current or the like can be accurately determined regardless of the mounting direction of the PLC 1.

Because constituent elements included in the second embodiment other than a power supply unit included in the PLC are identical to those in the first embodiment, as for the constituent elements other than a power supply unit 50, names and reference signs identical to those of the first embodiment are used, and redundant explanations thereof will be omitted. Furthermore, as for constituent elements of the power supply unit according to the second embodiment having functions identical to those of the first embodiment, names and reference signs identical to those of the first embodiment are used, and redundant explanations thereof will be omitted.

Figure 10:
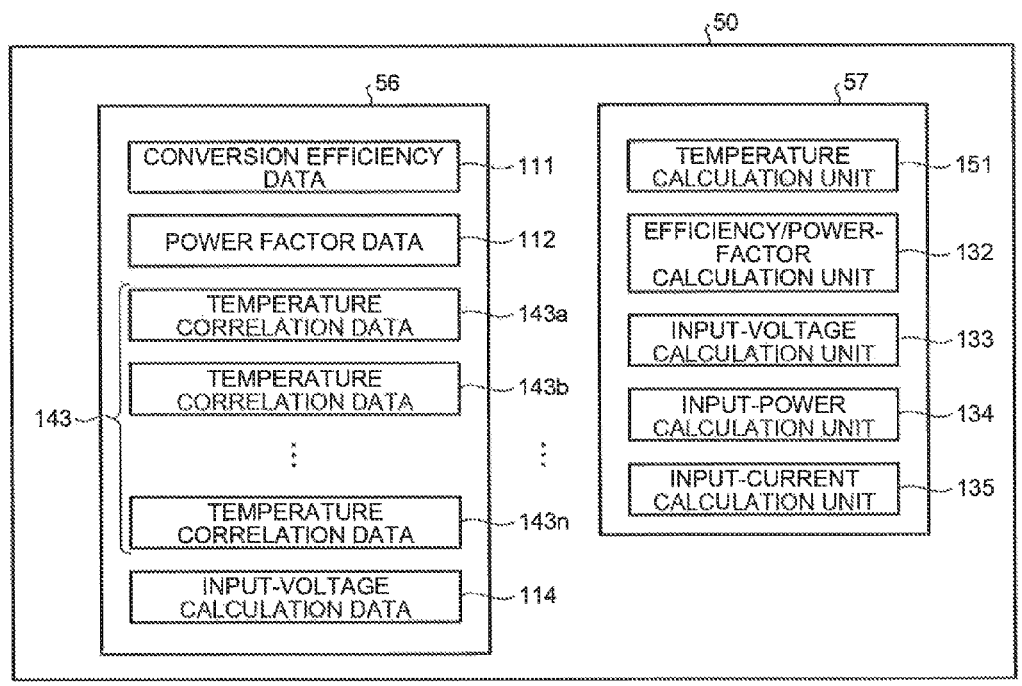
FIG. 10 is an explanatory diagram of a configuration of a power supply unit according to a second embodiment that is different from the configuration of the first embodiment.

FIG. 10 is an explanatory diagram of a configuration of a power supply unit according to the second embodiment that is different from the configuration of the first embodiment. As shown in FIG. 10, the power supply unit 50 includes a storage device 56 instead of the storage device 16 and a computation unit 57 instead of the computation unit 17. The conversion efficiency data 111, the power factor data 112, temperature correlation data 143 prepared for each expected mounting direction (temperature correlation data 143a, 143b, . . . , 143n), and the input-voltage calculation data 114 are stored in the storage device 56 in advance.

The computation unit 57 includes a temperature calculation unit 151, the efficiency/power-factor calculation unit 132, the input-voltage calculation unit 133, the input-power calculation unit 134, and the input-current calculation unit 135. When calculating the apparatus ambient temperature from the in-apparatus temperature, the temperature calculation unit 151 selects temperature correlation data according to the direction of mounting the PLC 1 among the temperature correlation data 143a to 143n and calculates the apparatus ambient temperature by using the selected temperature correlation data. The mounting direction can be provided by user's setting or a mechanism that detects the mounting direction is incorporated and the mounting direction can be provided by this mechanism.

Because operations of the power supply unit 50 according to the second embodiment are identical to those of the first embodiment except that an operation of selecting the temperature correlation data is added in the process of Step S3 explained in the first embodiment, explanations thereof will be omitted.

As explained above, according to the second embodiment of the present invention, plural pieces of the temperature correlation data 143 formed for the respective directions of installing the PLC 1 itself are stored in the storage device 56 in advance and temperature correlation data used among the plural pieces of temperature correlation data is changed according to the direction of installing the PLC 1 itself. Accordingly, even when the direction of installing the PLC 1 is changed, the input power or the like can be calculated accurately.

Third Embodiment

The conversion efficiency data 111 has a table configuration in which a correspondence between the efficiency η and the apparatus ambient temperature is described. The correspondence is generally described for every predetermined step size. As this step size becomes minister, the correspondence relationship between the efficiency η and the apparatus ambient temperature is expressed more accurately. The apparatus ambient temperature is made to correspond to the in-apparatus temperature (an average temperature of detected values of the temperature sensors 14) one-by-one by the temperature correlation data 113. Meanwhile, a positive correlation is provided between the magnitude of temperature dependency of a part and the magnitude of the influence on the efficiency η exerted by the part. A part with large temperature dependency easily generates heat and the temperature is easily increased as approaching nearer to the part. According to a third embodiment, the computation unit uses a weighted average of detected values of the temperature sensors 14 as the in-apparatus temperature so that the temperature sensor 14 that the influence on the efficiency η by a neighboring part is large can reflect greatly a change in detected value in a value calculated as the in-apparatus temperature. Accordingly, the computation unit can calculate the efficiency η at a minute step size with respect to a temperature detected value near a part whose influence on the efficiency η is large and at a large step size with respect to a temperature detected value near a part whose influence on the efficiency η is small. Consequently, the computation unit can determine the input power more accurately as compared to a case of using a simple average of the temperature sensors 14 equally arranged within the power supply unit as the in-apparatus temperature.

Because constituent elements included in the third embodiment other than a power supply unit included in the PLC are identical to those in the first embodiment, as for the constituent elements other than the power supply unit, names and reference signs identical to those of the first embodiment are used, and redundant explanations thereof will be omitted. Furthermore, as for constituent elements of the power supply unit according to the third embodiment having functions identical to those of the first embodiment, names and reference signs identical to those of the first embodiment are used, and redundant explanations thereof will be omitted.

Figure 11:
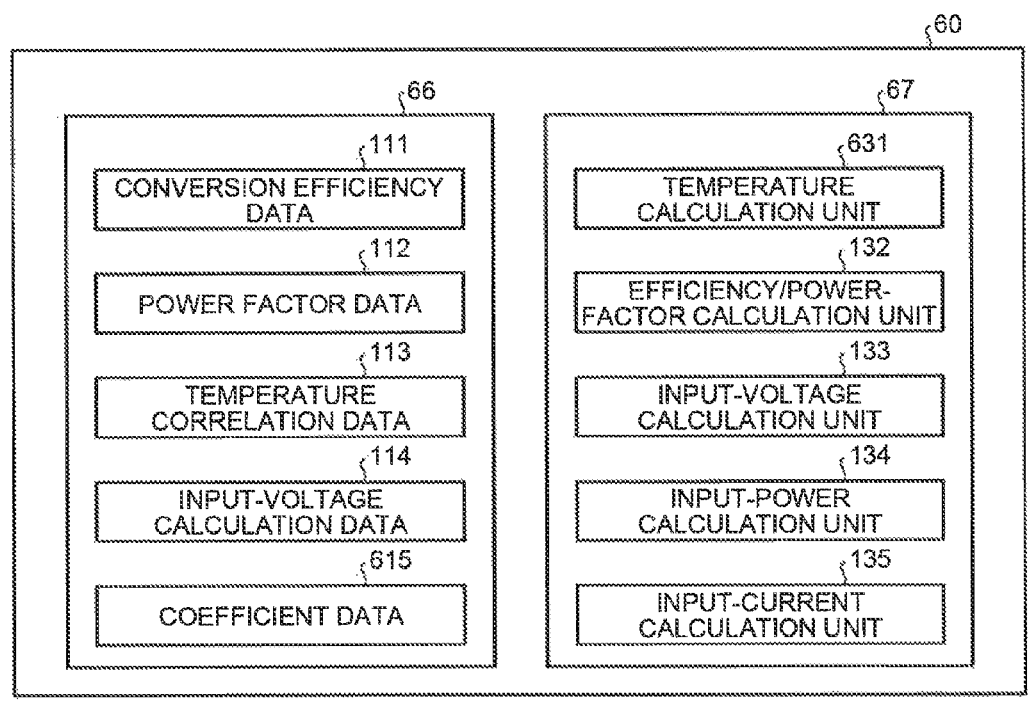
FIG. 11 is an explanatory diagram of a configuration of a power supply unit according to a third embodiment that is different from the configuration of the first embodiment.

FIG. 11 is an explanatory diagram of a configuration of a power supply unit according to the third embodiment that is different from the configuration of the first embodiment. As shown in FIG. 11, a power supply unit 60 includes a storage device 66 instead of the storage device 16 and a computation unit 67 instead of the computation unit 17. The conversion efficiency data 111, the power factor data 112, the temperature correlation data 113, the input-voltage calculation data 114, and coefficient data 615 are stored in the storage device 66 in advance.

The coefficient data 615 is data in which nine temperature sensors 14 shown in FIG. 4-1 are made to correspond to weighted coefficients and the correspondence thereof is described. In the coefficient data 615, a larger weighted coefficient is made to correspond to the temperature sensor 14 that the influence on the efficiency η exerted by a neighboring part is larger. Examples of the part in which the influence on the efficiency η is larger than those of other parts include an FET, a transformer, a shunt resistor, and a diode. Among these elements, the FET and the transformer have a larger influence on the efficiency η than the shunt resistor and the diode. That is, the magnitude of the weighted coefficient is (the temperature sensors 14 near the FET and the transformer)>(the temperature sensors 14 near the shunt resistor and the diode)≥ (other temperature sensors 14).

The computation unit 67 includes a temperature calculation unit 631, the efficiency/power-factor calculation unit 132, the input-voltage calculation unit 133, the input-power calculation unit 134, and the input-current calculation unit 135.

The temperature calculation unit 631 calculates a weighted average of detected values of the nine temperature sensors 14 by using the coefficient data 615 and uses the calculated weighted average as the in-apparatus temperature. The temperature calculation unit 631 then refers to the temperature correlation data 113 and calculates the apparatus ambient temperature corresponding to the determined in-apparatus temperature.

Because operations of the power supply unit 60 according to the third embodiment are identical to those of the first embodiment except that the temperature calculation unit 631 calculates the weighted average by using weighted coefficients for the respective temperature sensors 14 described in the coefficient data 615 in the process of Step S2 explained in the first embodiment, explanations thereof will be omitted.

As explained above, according to the third embodiment of the present invention, the temperature calculation unit 631 is configured so as to calculate the weighted average of measured values of the temperature sensors 14 so that a temperature measured value near a part in which the influence on the efficiency η is larger has a larger weighted coefficient and use the calculated value as the in-apparatus temperature. Accordingly, the computation unit 67 can calculate the efficiency η at a minute step size with respect to the temperature detected value near the part in which the influence on the efficiency η is large and at a large step size with respect to the temperature detected value near the part in which the influence on the efficiency η is small. Consequently, the computation unit 67 can determine the input power more accurately as compared to a case of using the simple average of the temperature sensors 14 equally arranged within the power supply unit as the in-apparatus temperature.

Similarly to the case of the efficiency η, a positive correlation is provided also between the magnitude of temperature dependency of a part and the magnitude of the influence on the power factor exerted by the part. Accordingly, by the temperature calculation unit 631 using the weighted average of detected values of the temperature sensors 14 as the in-apparatus temperature, the power factor φ is calculated at a minute step size with respect to a temperature detected value near a part in which the influence on the power factor φ is large and at a large step size with respect to a temperature detected value near a part in which the influence on the power factor φ is small.

Fourth Embodiment

While the precision of calculating the input power is improved by the computation unit 67 using the weighted average of detected values of the respective temperature sensors 14 as the in-apparatus temperature in the third embodiment, effects identical to those in the third embodiment can be obtained by devising a position where the temperature sensor 14 is located. Because configurations of a PLC according to the fourth embodiment are identical to those of the first embodiment except for the locating position of the temperature sensor 14, only the locating position of the temperature sensor 14 is explained and redundant explanations of the configurations will be omitted.

Figures 1, 12:
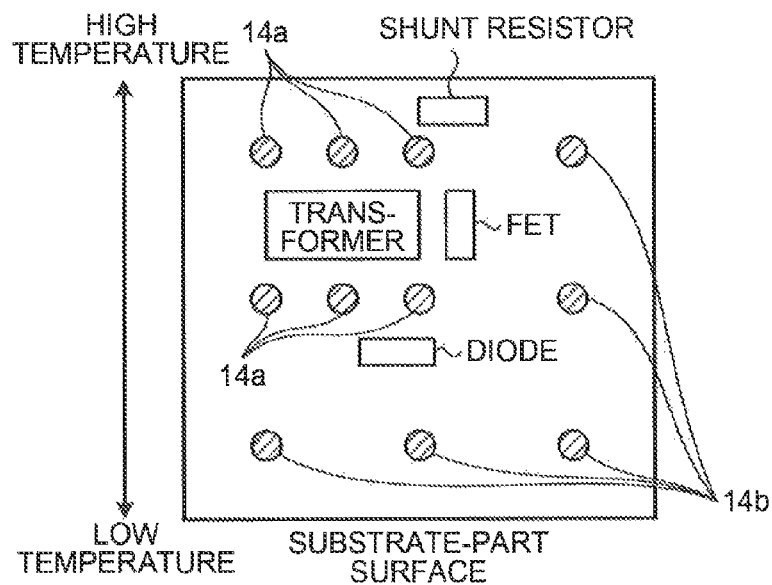
Figures 2, 12:
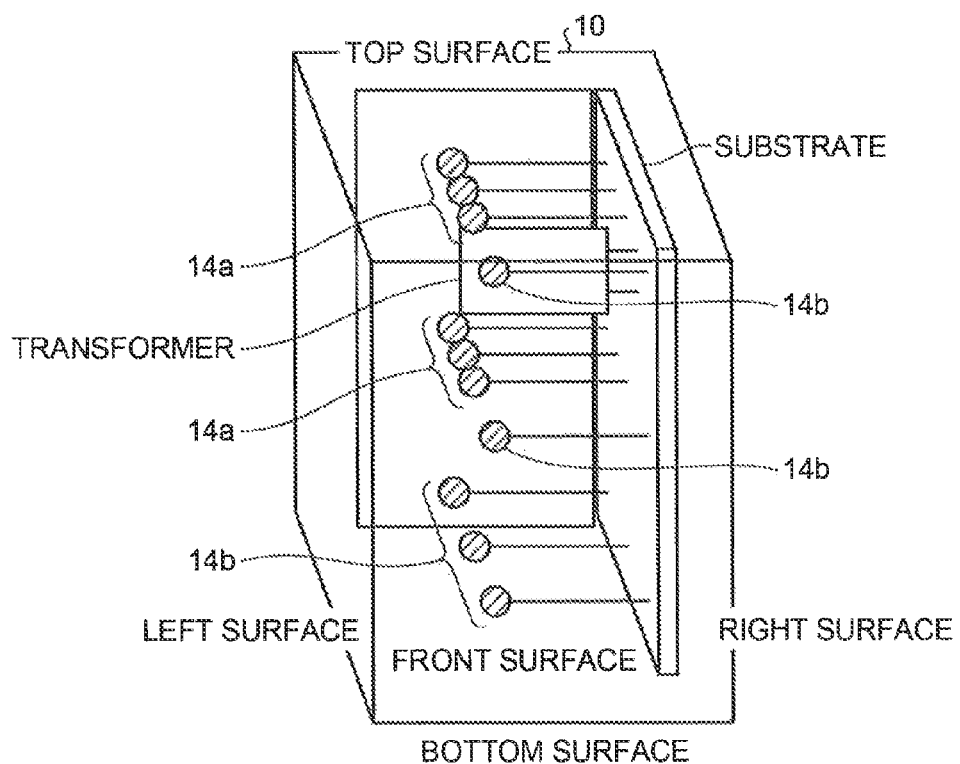

FIGS. 12-1 and 12-2 are explanatory diagrams of an arrangement example of the temperature sensors 14 according to a fourth embodiment, FIG. 12-1 depicts the substrate-part surface within the power supply unit 10 as viewed from a top surface. As shown in FIG. 12-1, the temperature sensors 14 are located intensively at a portion where a transformer, an FET, a shunt resistor, and a diode that greatly influence the efficiency η are intensively arranged (temperature-sensor installation positions 14a), and the temperature sensors 14 are located at larger intervals than those of the temperature-sensor installation positions 14a at other portions (temperature-sensor installation positions 14h). FIG. 12-2 is a perspective diagram of the inside of the power supply unit 10. In FIG. 12-2, the FET, the shunt resistor, and the diode are omitted for simplicity. As shown in FIGS. 12-1 and 12-2, the density of the temperature-sensor installation positions 14a is twice the density of the temperature-sensor installation positions 14b.

The temperature calculation unit 131 calculates the in-apparatus temperature by simply averaging detected values of the temperature sensors 14 at the temperature-sensor installation positions 14a and 14b. Because more temperature sensors 14 are located near the part in which the influence on the efficiency η is large, the temperature calculation unit 131 can obtain the same value as a value when the weighted average of detected values of the temperature sensors 14 equally arranged within the power supply unit, is calculated by calculating the simple average of detected values of the temperature sensors 14 at these temperature-sensor installation positions 14a and 14b. That is, the computation unit 17 can calculate the efficiency η at a minute step size with respect to the temperature detected value near the part in which the influence on the efficiency η is large and at a relatively large step size with respect to the temperature detected value near the part in which the influence on the efficiency η is small.

As explained above, according to the fourth embodiment of the present invention, more temperature sensors are located near the part in which the influence on the efficiency η is large. Accordingly, similarly to the third embodiment, the computation unit 17 can determine the input power more accurately as compared to the case of using the simple average of the temperature sensors 14 equally arranged within the power supply unit as the in-apparatus temperature.

While the first to fourth embodiments have explained a case of applying the controller according to the embodiments of the present invention to a PLC, the controller to which the controller according to the embodiments of the present invention is applied is not limited to a PLC. For example, a controller including an AC/DC converter such as an inverter that temporarily generates a direct-current power supply from an alternating-current commercial power supply and generates a desired alternating-current power supply from the generated direct-current power supply or a servo amplifier that generates a direct-current power supply from a commercial power supply and drives a motor by using the generated direct-current power supply can be applied. In addition, the power supply apparatus to which the embodiments of the present invention are applied may be configured to be inseparable from a controller.

INDUSTRIAL APPLICABILITY

As described above, the power supply apparatus and the controller according to the present invention are suitable to be applied for a power supply apparatus including an AC/CD converter and a controller including an AC/CD converter, respectively.

REFERENCE SIGNS LIST 1, 2 PLC
3 programmable display device
10, 50, 60 power supply unit
11 AC/DC converter
12 output-voltage measurement unit
13 load-current measurement unit
14 temperature sensor
14a, 14b temperature-sensor installation position
15 input-voltage detection-signal generation unit
16, 56, 66 storage device
17, 57, 67 computation unit
18 communication I/F
19 display unit
20 CPU unit
30 network unit
40 PLC bus
101 CPU
102 ROM
103 RAM
104 AD conversion circuit
105 I/O port
106 power monitoring program
111 conversion efficiency data
112 power factor data
113, 143, 143a to 143n temperature correlation data
114 input-voltage calculation data
121 AC-input detecting circuit
122 signal insulation circuit
131, 151, 631 temperature calculation unit
132 efficiency/power-factor calculation unit
133 input-voltage calculation unit
134 input-power calculation unit
135 input-current calculation unit
615 coefficient data

The invention claimed is:

1. A power supply apparatus comprising:
an AC/DC converter that takes an alternating-current commercial power supply as an input, generates a direct current power supply, and outputs the generated direct-current power supply;
an output-voltage measurement unit that measures an output voltage of a direct-current power supply output by the AC/DC converter;
an output-current measurement unit that measures an output current of a direct-current power supply output by the AC/DC converter;
a temperature measurement unit that measures an environmental temperature;
a storage device that stores therein in advance conversion efficiency data in which a correspondence between a conversion efficiency η of the AC/DC converter and the environmental temperature is recorded; and a computation unit that determines the conversion efficiency η based on a measured value of an environmental temperature by the temperature measurement unit and the conversion efficiency data, calculates input power of a commercial power supply input to the AC/DC converter by using the determined conversion efficiency η, a measured value of an output voltage by the output-voltage measurement unit, and a measured value of an output current by the output-current measurement unit, and outputs the calculated input power.

2. The power supply apparatus according to claim 1, wherein the computation unit calculates the input power by using a relational expression of "input power=output voltage×output current/conversion efficiency η".

3. The power supply apparatus according to claim 1, further comprising an input-voltage measurement unit that measures an input voltage of a commercial power supply input to the AC/DC converter, wherein the storage device stores therein in advance power factor data in which a correspondence between a power factor φ of the AC/DC converter and an environmental temperature is recorded, and the computation unit determines the power factor φ based on a measured value of an environmental temperature by the temperature measurement unit and the power factor data, calculates an input current of a commercial power supply input to the AC/DC converter by using the determined conversion efficiency η and the determined power factor φ, a measured value of an output voltage by the output-voltage measurement unit, a measured value of an output current by the output-current measurement unit, and a measured value of an input voltage by the input-voltage measurement unit, and outputs the calculated input current.

4. The power supply apparatus according to claim 3, wherein the computation unit calculates the input current by using a relational expression of "input current=output voltage×output current/(input voltage×conversion efficiency η×power factor φ)".

5. The power supply apparatus according to claim 1, wherein the temperature measurement unit includes a temperature sensor that is provided at a plurality of points within the power supply apparatus itself, and a temperature calculation unit that calculates a measured value of the environmental temperature from temperature detected values by the temperature sensors.

6. The power supply apparatus according to claim 5, wherein a measured value of the environmental temperature is an average value of temperature detected values by the temperature sensors.

7. The power supply apparatus according to claim 5, wherein a measured value of the environmental temperature is a weighted average of temperature detected values of the temperature sensors, and a larger weighted coefficient is applied to a temperature sensor in which an influence on the conversion efficiency η exerted by a neighboring part is larger.

8. The power supply apparatus according to claim 6, wherein more temperature sensors are located near a part in which an influence on the conversion efficiency η is larger.

9. The power supply apparatus according to claim 5, wherein a measured value of the environmental temperature is an estimated value of an ambient temperature of a machine in which the power supply apparatus itself is incorporated, the storage device stores therein in advance temperature correlation data in which a correspondence relationship between an average value of temperature detected values by the temperature sensors and an ambient temperature of the machine in which the power supply apparatus itself is incorporated is described, the temperature calculation unit calculates an average value of temperature detected values by the temperature sensors and calculates a measured value of an environmental temperature based on the calculated average value of temperature detected values and the temperature correlation data.

10. The power supply apparatus according to claim 9, wherein the storage device stores therein in advance plural pieces of temperature correlation data formed for respective directions of installing a machine in which the power supply apparatus itself is incorporated, the temperature calculation unit changes temperature correlation data used among plural pieces of temperature correlation data stored in the storage device according to a direction of installing the machine in which the power supply apparatus itself is incorporated.

11. The power supply apparatus according to claim 3, wherein the conversion efficiency data is data in which a correspondence among the conversion efficiency η of the AC/DC converter, an environmental temperature, and an output current of the AC/DC converter is recorded, the power factor data is data in which a correspondence among the power factor φ of the AC/DC converter, an environmental temperature, and an output current of the AC-DC converter is recorded, and the computation unit determines the conversion efficiency η based on a measured value of an environmental temperature by the temperature measurement unit, a measured value of an output current by the output-current measurement unit, and the conversion efficiency data, and determines the power factor φ based on a measured value of the environmental temperature, a measured value of an output current by the output-current measurement unit, and the power factor data.

12. The power supply apparatus according to claim 3, wherein the input-voltage measurement unit includes an input-voltage detection unit that adjusts a wave height of an input voltage wave of the commercial power supply, a signal insulation circuit that takes an input voltage wave whose wave height is adjusted as an input, and outputs a pulse wave that becomes ON when an input voltage value is equal to or larger than a predetermined threshold, where an input side and an output side of the signal insulation circuit is electrically isolated from each other, and an input-voltage calculation unit that calculates an input voltage of the commercial power supply based on a pulse wave output by the signal insulation circuit.

13. The power supply apparatus according to claim 3, further comprising a display unit that displays and outputs input power or an input current output by the computation unit.

14. A controller including an AC/DC converter that, takes an alternating-current commercial power supply as an input, generates a direct-current power supply, and outputs the generated direct-current power supply, the controller comprising:

an output-voltage measurement unit that measures an output voltage of a direct-current power supply output by the AC/DC converter;

an output-current measurement unit that measures an output current of a direct-current power supply output by the AC/DC converter;

a temperature measurement unit that measures an environmental temperature;

a storage device that stores therein in advance conversion efficiency data in which a correspondence between a conversion efficiency $\eta$ of the AC/DC converter and the environmental temperature is recorded; and a computation unit that determines the conversion efficiency $\eta$ based on a measured value of an environmental temperature by the temperature measurement unit and the conversion efficiency data, calculates input power of a commercial power supply input to the AC/DC converter by using the determined conversion efficiency $\eta$, a measured value of an output voltage by the output-voltage measurement unit, and a measured value of an output current by the output-current measurement unit, and outputs the calculated input power.

15. The controller according to claim 14, wherein the computation unit calculates the input power by using a relational expression of "input power=output voltage×output current/conversion efficiency $\eta$".

16. The controller according to claim 14, further comprising an input-voltage measurement unit that measures an input voltage of a commercial power supply input to the AC/DC converter, wherein the storage device stores therein in advance power factor data in which a correspondence between a power factor $\phi$ of the AC/DC converter and an environmental temperature is recorded, and the computation unit determines the power factor $\phi$ based on a measured value of an environmental temperature by the temperature measurement unit and the power factor data, calculates an input current of a commercial power supply input to the AC/DC converter by using the determined conversion efficiency $\eta$ and the determined power factor $\phi$, a measured value of an output voltage by the output-voltage measurement unit, a measured value of an output current by the output-current measurement unit, and a measured value of an input voltage by the input-voltage measurement unit, and outputs the calculated input current.

17. The controller according to claim 16, wherein the computation unit calculates the input current by using a relational expression of "input current=output voltage×output current/(input voltage×conversion efficiency $\eta$×power factor $\phi$)".

18. The controller according to claim 16, wherein the controller is a programmable controller, and further comprises an external output unit that outputs input power or an input current calculated by the computation unit to an external device connected to the programmable controller itself.

* * * * *